United States Patent
Wu et al.

(10) Patent No.: US 10,509,519 B2
(45) Date of Patent: Dec. 17, 2019

(54) ELECTROSTATIC DISCHARGE CIRCUIT, DISPLAY PANEL WITH ELECTROSTATIC DISCHARGE CIRCUIT AND ELECTROSTATIC DISCHARGE METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Hao Wu, Beijing (CN); Na An, Beijing (CN); Xinfeng Gong, Beijing (CN); Gang Ci, Beijing (CN); Baolei Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/528,738

(22) PCT Filed: May 26, 2016

(86) PCT No.: PCT/CN2016/083455
§ 371 (c)(1),
(2) Date: May 22, 2017

(87) PCT Pub. No.: WO2017/156874
PCT Pub. Date: Sep. 21, 2017

(65) Prior Publication Data
US 2018/0059821 A1 Mar. 1, 2018

(30) Foreign Application Priority Data
Mar. 14, 2016 (CN) .......................... 2016 1 0143752

(51) Int. Cl.
*G06F 3/044* (2006.01)
*H01L 23/60* (2006.01)
(Continued)

(52) U.S. Cl.
CPC .............. *G06F 3/044* (2013.01); *G06F 3/041* (2013.01); *H01L 23/60* (2013.01); *H05K 9/0024* (2013.01)

(58) Field of Classification Search
CPC .............................. G06F 3/044; H05K 9/0024
See application file for complete search history.

(56) References Cited

U.S. PATENT DOCUMENTS

2004/0008293 A1 * 1/2004 Ishiyama .......... G02F 1/134327
349/43
2007/0070047 A1 * 3/2007 Jeon .................... G02F 1/13338
345/173
(Continued)

FOREIGN PATENT DOCUMENTS

CN 102999223 A 3/2013
CN 103092397 A 5/2013
(Continued)

OTHER PUBLICATIONS

International Search Report and Written Opinion dated Dec. 21, 2017, for corresponding PCT Application No. PCT/CN2016/083455.
(Continued)

*Primary Examiner* — Shaheda A Abdin
(74) *Attorney, Agent, or Firm* — Kinney & Lange, P.A.

(57) ABSTRACT

Embodiments of the present invention disclose a display panel comprising a circuit board, a driving chip and a touch panel. The display panel further comprises an electrostatic discharge circuit disposed between the circuit board and the touch panel. The electrostatic discharge circuit defines an electrostatic discharge path electrically connecting the circuit board with the touch panel, and a second path through the driving chip is provided between the circuit board and the touch panel, wherein the overall impedance of the electrostatic discharge path is smaller than the overall
(Continued)

impedance of the second path. Also a display device including the display panel is disclosed.

10 Claims, 4 Drawing Sheets

(51) Int. Cl.
*G06F 3/041* (2006.01)
*H05K 9/00* (2006.01)

(56) References Cited

U.S. PATENT DOCUMENTS

| | | | |
|---|---|---|---|
| 2008/0204379 A1* | 8/2008 | Perez-Noguera | G06F 1/1605 345/80 |
| 2013/0229364 A1* | 9/2013 | Yu | G06F 3/044 345/173 |

FOREIGN PATENT DOCUMENTS

| | | |
|---|---|---|
| CN | 202939576 U | 5/2013 |
| CN | 103294238 A | 9/2013 |
| CN | 103927032 A | 7/2014 |
| CN | 105607780 A | 5/2016 |

OTHER PUBLICATIONS

First Chinese Office Action, for Chinese Patent Application No. 201610143752.2, dated Dec. 13, 2017, 16 pages.

* cited by examiner

ELECTROSTATIC DISCHARGE CIRCUIT, DISPLAY PANEL WITH ELECTROSTATIC DISCHARGE CIRCUIT AND ELECTROSTATIC DISCHARGE METHOD

CROSS-REFERENCE TO RELATED APPLICATION

This application claims the benefit of Chinese Patent Application No. 201610143752.2 filed on Mar. 14, 2016 in the State Intellectual Property Office of China, the whole disclosure of which is incorporated herein by reference.

FIELD OF THE INVENTION

Embodiments of the present invention relate to a display device, and more particularly to an electrostatic discharge circuit structure and an electrostatic discharge method for a display device. More specifically, embodiments of the present invention relate to an electrostatic discharge circuit, a display panel with an electrostatic discharge circuit, and an electrostatic discharge method for a display panel.

DESCRIPTION OF THE RELATED ART

The design and protection of Electro-Static Discharge (ESD) must be considered in the existing manufacturing process of display modules or display panels (TLCM) comprising a touch part and a display part. FIG. 1 shows an electrostatic discharge (ESD) path of a conventional TLCM. As shown in the figure, electrostatic charges are transferred from a slot, for example, at a position of a camera or the like, on the casing of a device, for example, a mobile phone, having a display module to a device mainboard. Since the circuit board, for example, the flexible circuit board FPC, is electrically connected to the device mainboard, electrostatic charges 30 may quickly reach the circuit board FPC 16. After being transmitted via the FPC, the electrostatic charges will find a path nearest to the ground to be discharged. In a conventional TLCM, a driving IC connected to the FPC is the closest path to an iron table 40 on which the device is placed, so that the electrostatic charges 30 are released along such a path. The electrostatic charges 30 affect the circuits, such as the register inside the IC, when passing through the IC. In a case that such an effect is not serious, it will cause a poor display, such as an instant black screen, which may be recovered after a restart. In a case that such an effect is serious, it will cause a functional damage, damaging the internal circuits.

It can be seen that the anti-static capacity of a conventional TLCM product in extreme cases is very limited, one of the most likely problems is that the display driver IC is damaged. Once it occurs, functional damages such as a black screen will occur on the display screen, so that the device such as a cell phone cannot work at all and lost its function, which has a serious impact on the quality of the product.

Accordingly, it is necessary to develop a display panel or display device with improved electrostatic discharge/protection capability.

SUMMARY OF THE INVENTION

In one embodiment of the present invention, a device with improved electrostatic discharge/protection capability is provided, which prevents electrostatic charges from entering the IC along a conventional path, such that a purpose of protecting their key electrical components is achieved.

According to an aspect of the present invention, there is provided a display panel comprising a liquid crystal display panel and a touch panel. A circuit board is provided on the liquid crystal display panel, and the circuit board and the touch panel are spaced apart from each other, wherein the display panel further comprises an electrostatic discharge circuit disposed between the circuit board and the touch panel and the electrostatic discharge circuit defines an electrostatic discharge path electrically connecting the circuit board with the touch panel.

In an embodiment, the electrostatic discharge circuit comprises a first conductive layer disposed on the touch panel.

In an embodiment, the electrostatic discharge circuit comprises a second conductive layer disposed on the first conductive layer.

In an embodiment, the electrostatic discharge circuit comprises a conductive adhesive region provided on the circuit board, and a conductive adhesive is provided in the conductive adhesive region.

In an embodiment, the electrostatic discharge circuit further comprises a second conductive layer disposed between the first conductive layer and the conductive adhesive region.

In an embodiment, the second conductive layer is bonded to the circuit board through the conductive adhesive.

Optionally, the first conductive layer comprises indium tin oxide (ITO) or indium zinc oxide (IZO).

Optionally, the second conductive layer comprises an Au ball or an Ag ball.

Optionally, a diameter of the Au ball or the Ag ball is equal to a distance between the first conductive layer and the conductive adhesive region.

In an embodiment, the circuit board is a flexible circuit board.

According to another aspect of the present invention, there is provided a display device comprising the display panel according to any one of above embodiments.

According to another aspect of the present invention, there is provided an electrostatic discharge circuit for discharging electrostatic charges on a first member through a second member which is grounded, wherein the electrostatic discharge circuit comprises a conductive adhesive region disposed on the first member, a first conductive layer disposed on the second member, and a second conductive layer disposed between the conductive adhesive region and the first conductive layer.

Optionally, the second conductive layer comprises an Au ball or an Ag ball.

Optionally, a diameter of the Au ball or the Ag ball is equal to a distance between the first conductive layer and the conductive adhesive region.

Optionally, the first member is a circuit board, and the second member is a touch panel.

According to another aspect of the present invention, there is provided an electrostatic discharge method for a display panel, the display panel comprising a circuit board, a touch panel, and an electrostatic discharge circuit provided between the circuit board and the touch panel, wherein the electrostatic discharge circuit forms an electrostatic discharge path electrically connecting the circuit board with the touch panel, and electrostatic charges transmitted to the circuit board are discharged through the electrostatic discharge path.

BRIEF DESCRIPTION OF THE DRAWINGS

Advantages of the present invention will become apparent from the following description of the embodiments of the present invention taken in conjunction with the accompanying drawings, and may provide a general understanding of the present invention, in which.

DETAILED DESCRIPTION OF PREFERRED EMBODIMENTS OF THE INVENTION

Figure 1:
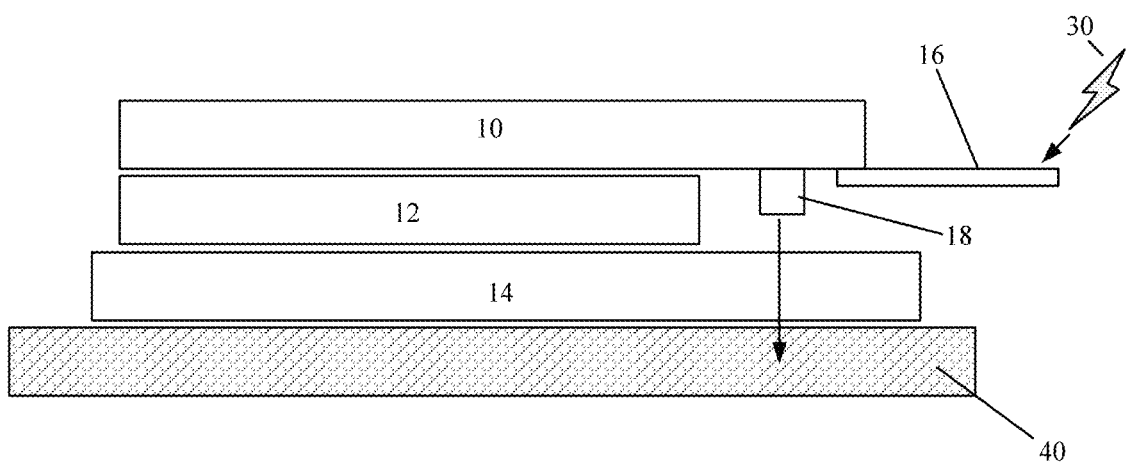
FIG. 1 is a front view of a conventional TLCM in which the electrostatic discharge path of a conventional TLCM is illustrated.

Hereinafter, specific embodiments of the present disclosure will be described in detail with reference to the accompanying drawings. It is to be understood that the specific embodiments described herein are for the purpose of illustration and explanation only and are not intended to be limiting of the invention.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the present disclosure, there is provided a display panel comprising a liquid crystal display panel and a touch panel. A circuit board being provided on the liquid crystal display panel, and the circuit board and the touch panel are spaced apart from each other, wherein the display panel further comprises an electrostatic discharge circuit disposed between the circuit board and the touch panel, and the electrostatic discharge circuit defines an electrostatic discharge path electrically connecting the circuit board with the touch panel. In addition, the embodiments of the present disclosure also provide a display device comprising the display panel, such as a TLCM product.

The display panel and the TLCM product according to the embodiments of the present invention have an improved ESD protection capability. By directly establishing a discharge path closer to the ground between the circuit board, for example FPC, of the liquid crystal display panel (LCD) of the display panel and the touch panel (TP) of the display panel, electrostatic charges are prevented from entering the display driver IC along the original path, such that a purpose of protecting their key electrical components is achieved.

Figure 2:
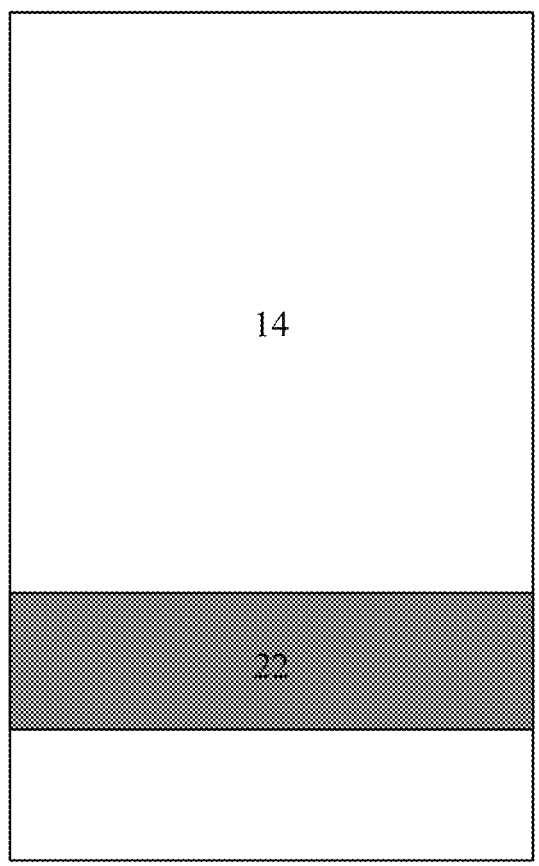
FIG. 2 is a top view of a TLCM according to an embodiment of the present invention, in which the structure of the touch panel is illustrated.
Figure 3:
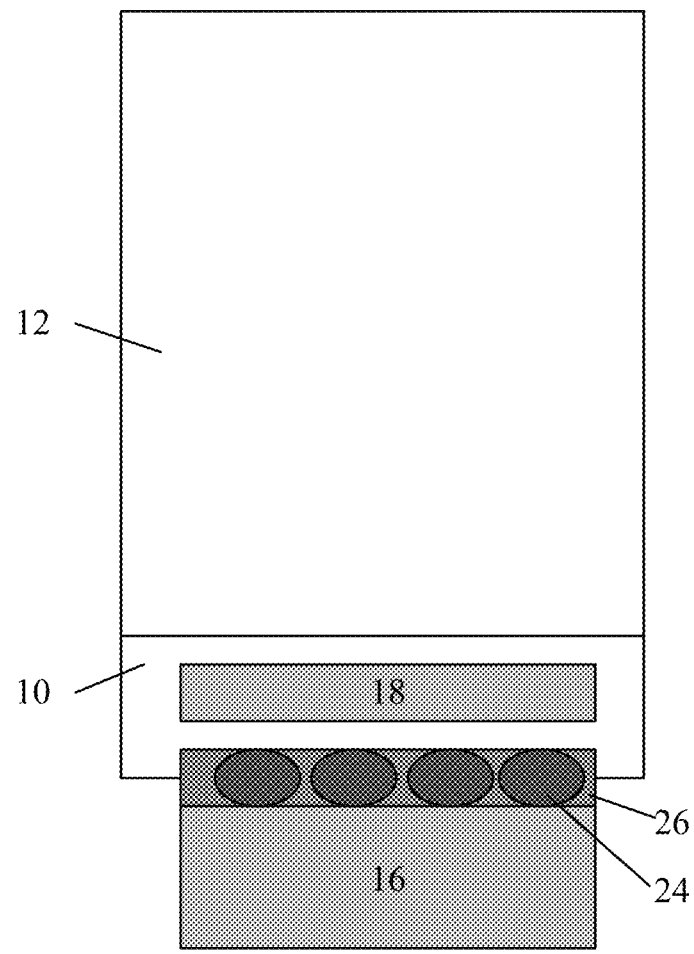
FIG. 3 is a bottom view of a TLCM according to an embodiment of the present invention, in which a TFT, a color film substrate and a flexible circuit board and the like are illustrated.
Figure 4:
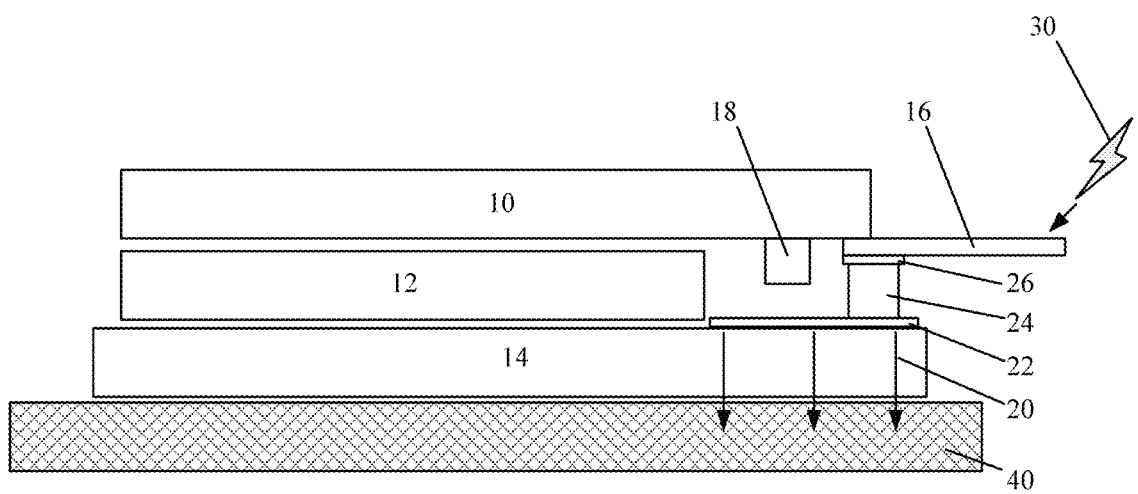
FIG. 4 is a front view of a TLCM in which an electrostatic discharge path of a TLCM according to an embodiment of the present invention is illustrated.

Specifically, FIG. 2 is a top view of a TLCM according to an embodiment of the present invention, in which the structure of the touch panel is illustrated; FIG. 3 is a bottom view of a TLCM according to an embodiment of the present invention, in which a TFT, a color film substrate and a flexible circuit board and the like are illustrated; and FIG. 4 is a front view of a TLCM in which an electrostatic discharge path of a TLCM according to an embodiment of the present invention is illustrated. The technical solution of the embodiments of the present invention will be described in detail with reference to FIGS. 2-4.

As shown in FIGS. 2-4, the display panel is, for example, a TLCM product, which may include a TFT 10, a color film substrate (CF) 12, and a touch panel 14. In FIG. 4, the TFT 10, the color film substrate (CF) 12, the touch panel 14 are stacked together in sequence from top to bottom. The circuit board 16 is provided on the TFT 10 and is electrically conductive to the TFT 10. Optionally, the circuit board 16 is a flexible circuit board (FPC). The driving IC chip, hereinafter referred to as IC for short, 18 is provided on the TFT 10 and is spaced apart from the FPC 16.

In the display panel according to the embodiment of the present invention, a special electrostatic discharge circuit 20 is provided between the FPC 16 and the touch panel 14. As shown in FIG. 2, the electrostatic discharge circuit 20 includes a first conductive layer 22 provided on the touch panel 14. Optionally, the first conductive layer 22 is indium tin oxide (ITO) or indium zinc oxide (IZO), and as long as the wiring of the touch panel 14 is not affected, laying area of the first conductive layer 22 on the touch panel 14 may be as large as possible to maximize the expansion of the conductive area.

Further, as shown in FIG. 3, the electrostatic discharge circuit 20 includes a second conductive layer 24. Optionally, the second conductive layer 20 consists of Au balls or Ag balls, so that the second conductive layer 24 can be easily formed. Further, the second conductive layer 24 is bonded to the circuit board 16 by conductive adhesive 26.

Accordingly, as shown in FIG. 4, an electrostatic discharge path of a TLCM according to the embodiments of the present disclosure is illustrated. Specifically, after the touch panel 14 and the LCM including components such as a TFT and a CF are assembled together, the conductive adhesive 26, the second conductive layer 24 optionally, the Au balls or the Ag balls, and the first conductive layer 22, optionally ITO or IZO, are in an electrically conductive state, such that an electrostatic discharge path which discharges electrostatic through the conductive adhesive 26, the second conductive layer 24, optionally, the Au ball or the Ag ball, and the first conductive layer 22, optionally, ITO or IZO, in turn may be formed between the circuit board 16 and the touch panel 14.

In the conventional TLCM shown in FIG. 1, there are portions which are not directly electrical contacted in the discharge path, i.e., the second path, passing through the IC 18. However, in the above embodiment, although there is still a second path, i.e., a conventional electrostatic discharge path, passing through the IC 18 between the circuit board 16 and the touch panel 14, the electrostatic discharge circuit includes a conductive adhesive 26, a second conductive layer 24 (optionally, an Au ball or an Ag ball, and the first conductive layer 22, optionally, ITO or IZO, which are electrically contacted in sequence. Therefore, the overall impedance of the electrostatic discharge path in accordance with embodiments of the present invention is significantly smaller than the overall impedance of the second path. Since the overall impedance of the electrostatic discharge path in the display panel according to embodiments of the present invention is smaller than the overall impedance of the second path, when electrostatic charges (identified by 30 in FIG. 4) are transmitted from the circuit board, through the newly established conductive electrostatic discharge path, electrostatic charges are transmitted from the circuit board to the conductive adhesive 26, the Au ball or Ag ball 24 and the ITO or IZO 22 in turn, and then be transmitted away thought TP closest to the ground, but not through the key component, IC, thus protecting the IC from being subjected to the static interference and damage, substantially improving the electrostatic protection ability of display panel.

Optionally, a diameter of the Au ball or the Ag ball 24 is equal to a distance between the first conductive layer 22 and the conductive adhesive 26 region. As such, the Au ball or the Ag ball 24 fills the gap between the first conductive layer 22 and the conductive adhesive 26, thereby ensuring a good conduction state.

In addition, the embodiments of the present invention further provide a display device including the display panel as described above.

Although the electrostatic discharge path and the electrostatic discharge method of the embodiments of the present invention are described with reference to the display panel, particularly the TLCM, the above-described embodiments are merely exemplary, and the electrostatic discharge path and the electrostatic discharge method of the embodiments of the present invention are not limited to the display panel, and may be applied to any device with an electrostatic discharge or electrostatic protection requirement.

Therefore, embodiments of the present invention also provide an electrostatic discharge circuit provided between a first member onto which the electrostatic charges are transmitted and a second member which is grounded. The electrostatic discharge circuit electrically connects the first member and the second member. The electrostatic discharge circuit comprises a conductive adhesive region disposed on the first member, a first conductive layer disposed on the second member, and a second conductive layer disposed between the conductive adhesive region and the first conductive layer.

Optionally, the first member may be a circuit board, and the second member may be a touch panel.

Optionally, the second conductive layer comprises an Au ball or an Ag ball.

More preferably, a diameter of the Au ball or the Ag ball is equal to a distance between the first conductive layer and the conductive adhesive region.

Although the present invention has been described with reference to the accompanying drawings, the embodiments shown in the drawings are intended to be illustrative of the embodiments of the invention and are not to be construed as limiting to the invention.

Although some embodiments of the present general inventive concept have been shown and described, it will be understood by those skilled in the art that various modifications may be made in these embodiments without departing from the principles and spirit of the present general inventive concept, and the scope of the present disclosure is defined by the claims and their equivalents.

What is claimed is:

1. A display panel, comprising a circuit board, a driving chip, a liquid crystal display panel and a touch panel, the circuit board being connected with the liquid crystal display panel, and the circuit board and the touch panel being spaced apart from each other in a direction of a thickness of the touch panel, wherein, the display panel further comprises an electrostatic discharge circuit disposed between the circuit board and the touch panel, and the electrostatic discharge circuit defines a first electrostatic discharge path electrically connecting the circuit board with the touch panel, wherein the electrostatic discharge circuit comprises a conductive adhesive provided on the circuit board, a first conductive layer disposed on the touch panel and a second conductive layer interposed between the conductive adhesive and the first conductive layer, the conductive adhesive covering the whole area of an end of the circuit board connected with the liquid crystal display panel, and a second electrostatic discharge path through the driving chip is provided between the circuit board and the touch panel, wherein an overall impedance of the first electrostatic discharge path is smaller than an overall impedance of the second electrostatic discharge path.

2. The display panel according to claim 1, wherein the electrostatic discharge circuit comprises a conductive adhesive region provided on the circuit board, and the conductive adhesive is provided in the conductive adhesive region.

3. The display panel according to claim 2, wherein the first conductive layer comprises indium tin oxide (ITO) or indium zinc oxide (IZO).

4. The display panel according to claim 1, wherein the second conductive layer is bonded to the circuit board through the conductive adhesive.

5. The display panel according to claim 1, wherein the first conductive layer comprises indium tin oxide (ITO) or indium zinc oxide (IZO).

6. The display panel according to claim 1, wherein the second conductive layer comprises an Au ball or an Ag ball.

7. The display panel according to claim 6, wherein a diameter of the Au ball or the Ag ball is equal to a distance between the first conductive layer and the conductive adhesive region.

8. A display device comprising the display panel according to claim 1.

9. An electrostatic discharge method for the display panel according to claim 1, wherein electrostatic charges transmitted to the circuit board are discharged through the first electrostatic discharge path.

10. The display panel according to claim 1, wherein the electrostatic discharge circuit is configured to discharge electrostatic charges on the circuit board through the touch panel which is grounded.

* * * * *